(12) United States Patent
Ishizuka

(10) Patent No.: US 7,868,635 B2
(45) Date of Patent: Jan. 11, 2011

(54) PROBE

(75) Inventor: Toshihiro Ishizuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/073,114

(22) Filed: Feb. 29, 2008

(65) Prior Publication Data

US 2008/0157797 A1 Jul. 3, 2008

Related U.S. Application Data

(62) Division of application No. 11/439,227, filed on May 24, 2006, now abandoned.

(30) Foreign Application Priority Data

Feb. 20, 2006 (JP) ............................. 2006-042313

(51) Int. Cl.
*G01R 1/067* (2006.01)
*G01R 31/00* (2006.01)
(52) U.S. Cl. ..................................... 324/762
(58) Field of Classification Search ................. 324/762, 324/757
See application file for complete search history.

(56) References Cited

U.S. PATENT DOCUMENTS

| | | | |
|---|---|---|---|
| 3,676,776 A | | 7/1972 | Bauer et al. |
| 3,835,381 A | * | 9/1974 | Garretson et al. ........... 324/762 |
| 3,996,516 A | * | 12/1976 | Luther ........................ 324/761 |
| 4,245,189 A | | 1/1981 | Wahl et al. |
| 4,307,928 A | | 12/1981 | Petlock, Jr. |
| 4,533,203 A | * | 8/1985 | Feldman et al. ............... 439/64 |
| 4,675,600 A | * | 6/1987 | Gergin ........................ 324/754 |
| 4,724,383 A | | 2/1988 | Hart |
| 4,835,465 A | * | 5/1989 | Gergin ........................ 324/754 |
| 5,151,653 A | * | 9/1992 | Yutori et al. ................. 324/754 |
| 5,425,649 A | | 6/1995 | Reymond |
| 5,729,147 A | * | 3/1998 | Schaff ......................... 324/755 |
| 5,926,028 A | | 7/1999 | Mochizuki |
| 6,249,135 B1 | * | 6/2001 | Maruyama et al. .......... 324/765 |
| 7,112,976 B2 | * | 9/2006 | Tokumo et al. ............. 324/761 |

FOREIGN PATENT DOCUMENTS

| | | |
|---|---|---|
| JP | 56-56646 | 5/1981 |
| JP | 5-92749 | 12/1993 |
| JP | 6-40869 | 5/1994 |
| JP | 11-51970 | 2/1999 |

* cited by examiner

*Primary Examiner*—Paresh Patel
(74) *Attorney, Agent, or Firm*—Kratz, Quintos & Hanson, LLP

(57) ABSTRACT

An object is to provide a probe, a probe card, and a testing device which can precisely perform a test for conductive state of a conductive wiring in, for example, a through hole or a contact hole provided in a circuit board. Provided is a probe (10) for performing a test for conductivity of a conductive wiring in a hole such as a through hole or a contact hole provided in a circuit board. The probe (10) is provided with an elastically deformable leg portion (11) and a contact portion (13) provided on a tip side of the leg portion (11) to be brought into contact with the conductive wiring (21) provided in a through hole (22). The contact portion (13) is formed to be in a shape and size so as to be prevented from entering the through hole (22).

2 Claims, 15 Drawing Sheets

PROBE

CROSS REFERENCE TO RELATED APPLICATION

This is a Divisional Application of U.S. patent application Ser. No. 11/439,227, filed on May 24, 2006 now abandoned, which is hereby incorporated by reference.

BACKGROUND OF THE INVENTION

1. Field of the Invention

The present invention relates to a probe (in particular, a cantilever type probe), a probe card, and a testing device. More particularly, the present invention relates to a probe, a probe card, and a testing device, especially suitable for testing a through hole (a via or a contact hole) to be filled with conductor, and which is provided in a circuit board, a wafer, or the like (hereinafter, referred to as "circuit board").

2. Description of the Related Technology

As illustrated in FIG. 19, a probe card 152 is used to conduct a short/open test on wiring 151 in a wafer or a circuit board 150. In some cases, a cantilever type probe 153 is adopted as the probe card 152. The probe 153 is provided so as to be precisely positioned in relation to the probe card 152. It should be noted that some probe cards have spring type probes (not shown) provided thereto.

The conventional cantilever type probe 153 has, as illustrated in FIG. 20, a tip side which is bent in a direction away from the probe card 152, thereby a linear contact portion 154 is formed. The contact portion 154 is formed in relatively thin. A rectangular portion 155 which is rectangular in section is provided to the tip of the contact portion 154.

In performing a test on the circuit board 150 using the probe card 152, the contact portion 154 of the probe 153 is brought into contact with the wiring 151 of the circuit board 150, and the probe card 152 further descends by a small distance. This makes the probe 153 elastically deformed to cause the contact portion 154 to slide a little over the wiring 151 in a longitudinal direction (in an X direction in FIG. 19) of the probe 153.

At this time, an oxide film formed on a surface of the wiring 151 is scraped off by the rectangular portion 155 of the contact portion 154, thereby attain stable electrical contact between the contact portion 154 of the probe 153 and the wiring 151.

[Patent Document 1] JP 11-51970 A

[Patent Document 2] JP 56-56646 A

[Patent Document 3] Japanese Utility Model Application Laid-open No. Hei 5-92749

[Patent Document 4] Japanese Utility Model Application Laid-open No. Hei 6-40869

However, when the probe card 152 having the conventional cantilever type probe 153 is used for testing a through hole provided in a circuit board and to be filled with the conductor to test how well it is filled with conductor the following problem arises.

FIG. 21 shows the circuit board 150 having a contact hole (via) 157 provided thereto. This contact hole 157 is formed by filling a through hole 158 with a conductor 159 to hole 158.

It should be noted that, descriptions of the conventional probe will be made on the premise that plating 160 is provide to an inner surface of the through hole 158 and a rear surface 150b of the circuit board 150. In reality, a front surface 150a and the rear surface 150b of the circuit board are provided with wiring connected thereto.

By providing the contact hole 157, the wiring (not shown) provided on the front surface 150a and the rear surface 150b of the circuit board 150 can be electrically connectable. Further, a space between the front surface 150a side and the rear surface 150b side of the circuit board 150 can be kept as hermetic.

When the probe card 152 is used for testing how well the contact hole 157 is filled with the conductor 159, the probe card 152 and the probe 153 are disposed, for example, on the side of the front surface 150a of the circuit board 150. Then, the contact portion 154 of the probe 153 is brought into contact with the conductor 159. With this state, the resistance between the front surface 150a and the rear surface 150b of the conductor 159 and the resistance of a plating 160 provided on the inner periphery of the through hole 158 are measured with the probe 153.

At this time, when the through hole 158 of the contact hole 157 is completely filled with the conductor 159, electric current for the measurement flows through both the plating 160 provided on the inner surface of the through hole 158 and the conductor 159, which relatively reduces the resistance.

On the other hand, when the through hole 158 is hardly filled with the conductor 159 as illustrated in FIG. 22, or, when the through hole 158 is only partly filled with the conductor 159 as shown by the double-dashed chain line is FIG. 22, the electric current for the measurement flows through only the plating 160 provided on the inner surface of the through hole 158.

Therefore, when the through hole 158 is hardly filled with the conductor 159, the resistance is relatively high as compared with a case where the through hole 158 is completely filled with the conductor 159. When only a part of the through hole 158 is filled with the conductor 159, the resistance is higher than that when the through hole 158 is completely filled with the conductor 159, and lower than that when the through hole 158 is hardly filled with the conductor 159.

Here, when the through hole 158 of the contact hole 157 is hardly filled with the conductor 159 or only a part of the through hole 159 is filled with the conductor 159 as described above, there is a possibility that the contact portion 154 of the probe 153 enters the through hole 158 as illustrated in FIG. 22.

When the contact portion 154 of the probe 153 has entered the through hole 158 as described above, there is a possibility that the contact portion 154 might be brought into contact with the lower portion side of the plating 160 in the through hole 158 or with a support 161 for supporting the circuit board 150, provided that the thickness t of the circuit board 150 is thin or the length of the contact portion 154 of the probe 153 is relatively longer with respect to the thickness t of the circuit board 150 (as shown by a broken line).

In such a case, the resistance measured by using the probe card 152 is lower than the actual resistance. More specifically, a problem arises that, although the through hole 158 is hardly filled with the conductor 159 or the through hole 158 is only partly filled with the conductor 159, the result of measuring the resistance would be similar to that of a case where the through hole 158 is completely filled with the conductor 159. As described above, the conventional probe 153 has a problem that it can not accurately measure how well the through hole 158 is filled with the conductor 159.

SUMMARY OF THE INVENTION

The present invention has been made in view of the above-mentioned problem, and an object is to provide a probe, a probe card, and a testing device for precisely testing the state } of a hole provided in a circuit board, in particular, how well a through hole provided in a circuit board and being to be filled with conductor, is filled with conductor.

In order to achieve the above object, the present invention adopts the following devices.

(1) The present invention is a probe performing a test for conductivity in conductive wiring in a hole such as, a through hole or a contact hole provided in a circuit board, comprising:

an elastically deformable leg portion; and a contact portion provided on a tip side of the leg portion to be brought into contact with the conductive wiring, wherein the contact portion is formed to be in a shape and size so as to be prevented from entering the hole.

Examples of the above-described hole include a through hole and a contact hole. According to the present invention, even when a hole in a circuit board where conductive wiring is to be provided is hardly filled with the conductive wiring, or, when the hole is only partly filled with the conductive wiring, the contact portion of the probe can be prevented from entering the hole. Therefore, conductivity in the conductive wiring in the hole can be precisely tested.

(2) Examples of the contact portion include the one in the shape of an arc having a radius of curvature larger than a radius of the hole.

(3) Examples of the contact portion also include the one linear in shape which is in parallel with a surface of the circuit board to be tested and is longer than a diameter of the through hole.

(4) Further, the present invention is a probe card having a probe to be brought into contact with the conductive wiring for performing a test for conductivity of the conductive wiring in a hole, such as a through hole or a contact hole, provided in a circuit board, the probe comprising:

an elastically deformable leg portion; and a contact portion provided on a tip side of the leg portion to be brought into contact with the conductive wiring, wherein the contact portion is formed to be in a shape and size so as to be prevented from entering the hole.

(5) Further, a testing device of the present invention comprises:

a probe card having a probe to be brought into contact with conductive wiring performing a test for conductivity of the conductive wiring in a hole, such as a through hole or a contact hole, provided in a circuit board;

a holding device holding the circuit board;

a position detecting device detecting whether or not the circuit board is disposed in a predetermined position;

a position adjusting device adjusting a position of the circuit board based on a result of the detection by the position detecting devices; and a resistance measuring device measuring, resistance of an inner peripheral portion of the hole and resistance between both ends of the conductive wiring with the probe, wherein the probe includes:

an elastically deformable leg portion; and a contact portion provided on a tip side of the leg portion to be brought into contact with the conductive wiring, wherein the contact portion is formed to be in a shape and size so as to be prevented from entering the hole.

As described above, according to the present invention, a contact portion of a probe can be prevented from getting in a hole provided in a circuit board. In particular, even when the through hole in a circuit board is hardly filled with conductor or the through hole is only partly filled with conductor, the contact portion of the probe can be prevented from entering the through hole. Therefore, it is possible to precisely test how well the through hole is filled with the conductor.

DETAILED DESCRIPTION OF THE INVENTION

Hereinbelow, embodiments of a probe, a probe card, and a testing device according to the present invention will be described in detail with reference to the drawings.

First Embodiment

Figure 1:
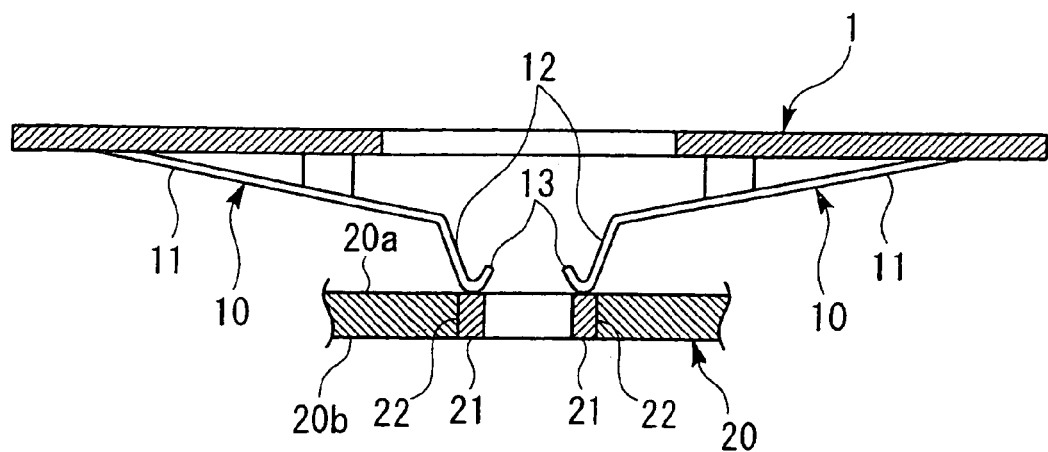
FIG. 1 is a diagram illustrating a probe and a probe card according to a first embodiment of the present invention.

FIG. 1 illustrates a cantilever type probe 10 and a probe card 1 using the probe 10 according to a first embodiment of the present invention. The probe card 1 is used for testing how well a through hole 22, which is provided in a circuit board 20 and is to be filled with a conductor 21, is filled with the conductor 21.

It should be noted that, in this embodiment, the through hole 22 is filled with the conductor 21 to form a contact hole (VIA).

The probe 10 is provided with an elastically deformable leg portion 11 diagonally extending from the probe card 1, a bent portion 12 which is provided on a tip side of the leg portion 11 and extends to the circuit board 20 side, and a contact portion 13 provided on a tip side of the bent portion 12.

Figure 2:
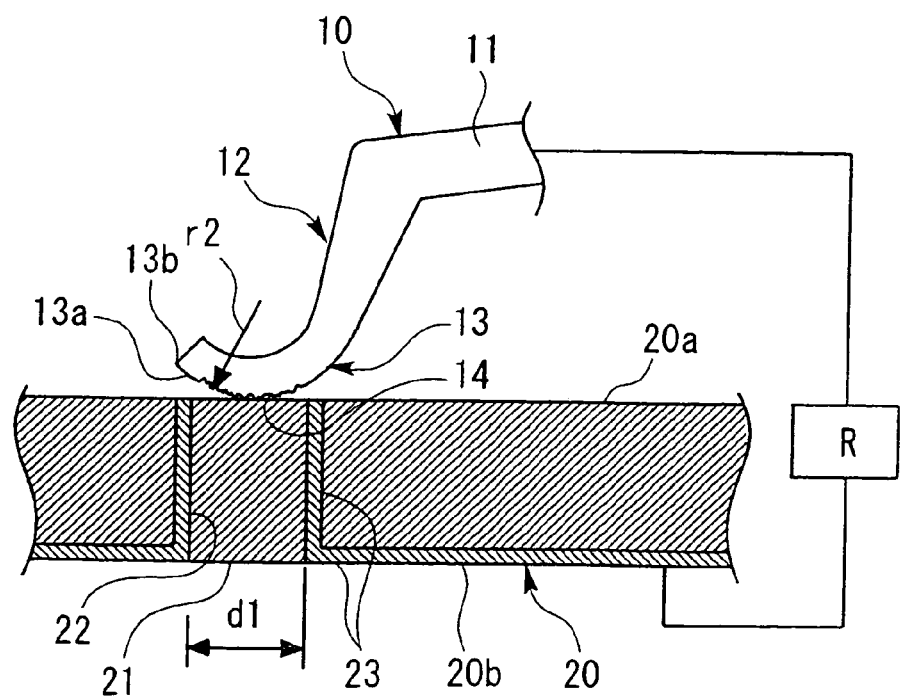
FIG. 2 is a diagram illustrating the probe according to the first embodiment of the present invention.

As illustrated in FIG. 2, the contact portion 13 is formed to be in a shape and size so as to be prevented from entering in the through hole 22 of the circuit board 20.

In this embodiment, the contact portion 13 is formed to have an arc-shape. Here, d1 denotes the diameter of the through hole 22 and r1 denotes the radius of the through hole 22, and when it is r1=d1/2, a contact surface 13a, which is an outer peripheral surface of the contact portion 13, has a radius of curvature r2 which is larger than the radius r1 of the through hole 22 (r2>r1).

The contact portion 13 is disposed over the through hole 22 to test how well the through hole 22 is filled with the conductor 21. It should be noted that a tip 13b of the contact portion 13 is disposed outside the through hole 22.

The bent portion 12 is formed by bending a tip side of the leg portion 11 in a direction away from the probe card 1 so as to form an appropriate angle. Further the contact portion 13 is formed by bending a tip side of the bent portion 12 in a direction toward the probe card 1 so as to form an arc.

When the through hole 22 is not filled with the conductor 21 (see FIG. 6), the contact surface 13a of the contact portion 13 slightly enters in the through hole 22, but only a little part of the contact surface 13a enters in the through hole 22. Therefore, it can be substantially assumed that the contact portion 13 hardly enters in the through hole 22.

Figure 3:
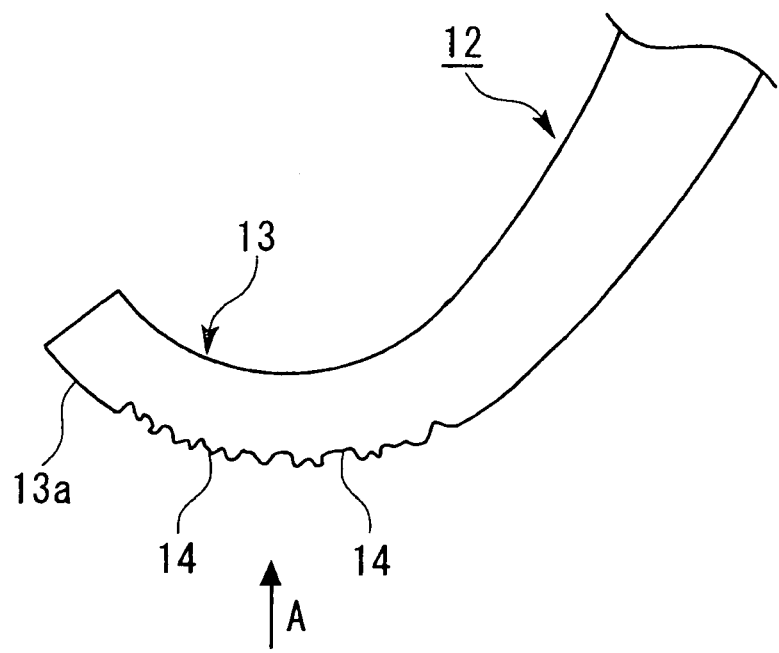
FIG. 3 is a diagram illustrating a rough surface having abrasion-like marks of the probe according to the first embodiment of the present invention.
Figure 4:
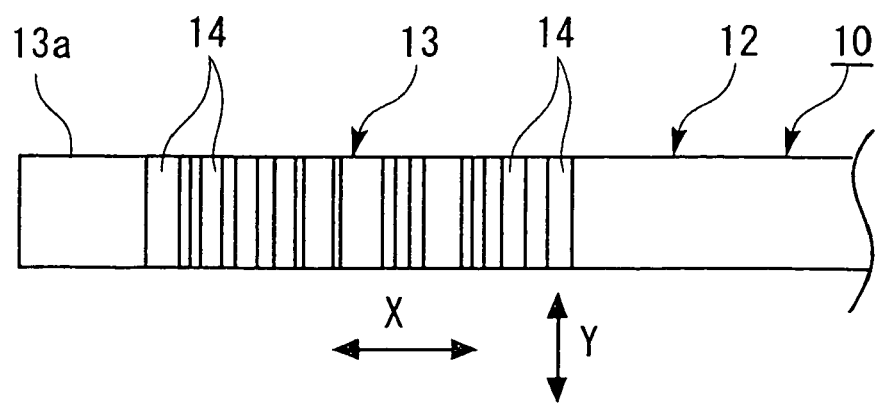
FIG. 4 is a diagram illustrating the rough surface having abrasion-like marks of the probe viewed from an arrow A in FIG. 3 according to the first embodiment of the present invention.

As illustrated in FIG. 3, abrasion marks 14 are provided over a predetermined area of the contact surface 13a of the contact portion 13 including a portion which is to be brought into contact with the conductor 21. As illustrated in FIG. 4, the abrasion marks 14 extend in a direction X which is substantially orthogonal to a longitudinal direction Y of the probe 10.

In the case to where the conductive state (filled state) of the conductor 21 in the through hole 22 provided in the circuit board 20 is tested by the probe card 1 provided the probe 10, the contact portion 13 of the probe 10 is disposed over the through hole 22 and the conductor 21 as illustrated in FIG. 2.

Here, when the through hole 22 is completely filled with the conductor 21, the contact portion 13 is brought into contact with the conductor 21. In this case, the resistance of a plating 23 and the resistance between the upper surface 20a and the lower surface 20b of the conductor 21 measured by the probe card 1 are relatively small. From this result of the measurement, it can be determined that the through hole 22 is completely filled with the conductor 21.

Figure 5:
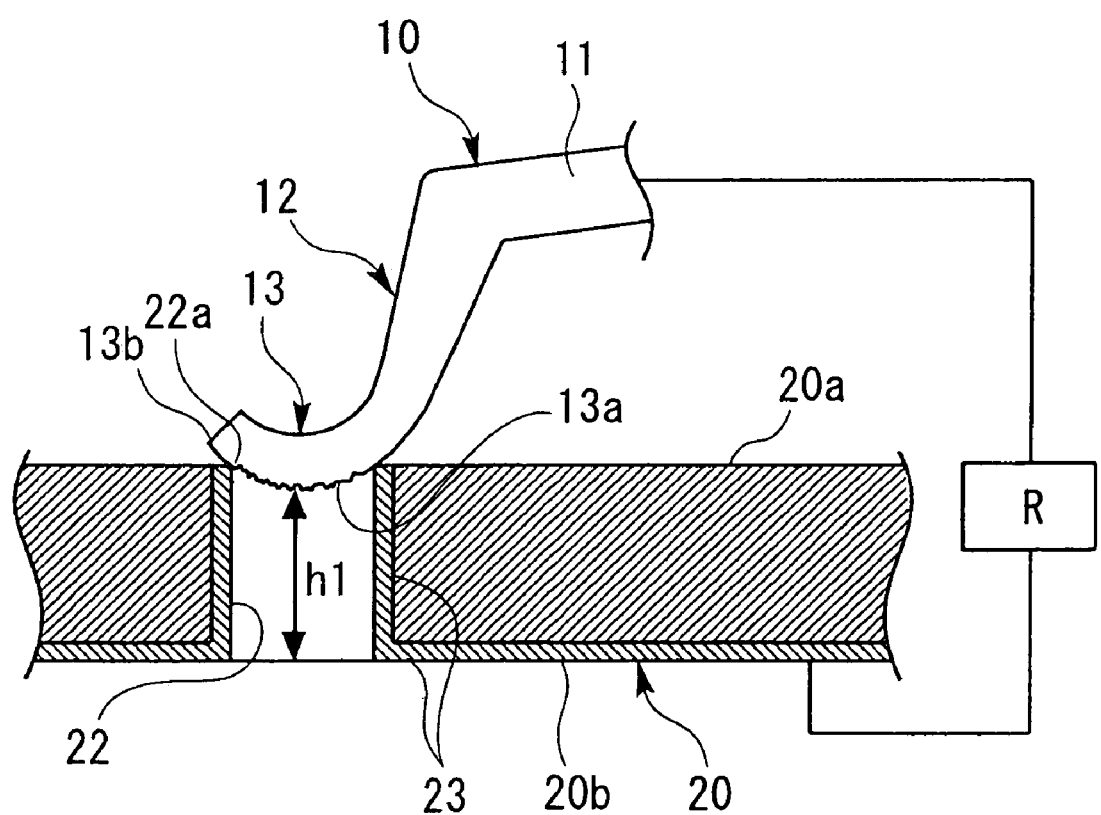
FIG. 5 is a sectional diagram illustrating a state of use of the probe of the first embodiment according to the present invention and illustrating a case where a through hole in a circuit board is not filled with conductor.

Further, as illustrated in FIG. 5, the through hole 22 is hardly filled with the conductor 21, the contact portion 13 straddles an opening 22a of the through hole 22 to be locked on the edge of the opening 22a. Thereby, the contact portion 13 is prevented from entering the through hole 22.

In this case, electric current for the measurement which flows between the probe 10 and the rear surface 20b of the circuit board 20 passes through only the plating 23 in the through hole 22. Accordingly, the resistance between the upper end surface 20a and the lower end surface 20b of the plating 23 is higher than that of a case where the through hole 22 is completely filled with the conductor 21. From this result, it can be determined that the through hole 22 is hardly filled with the conductor 21.

Figure 6:
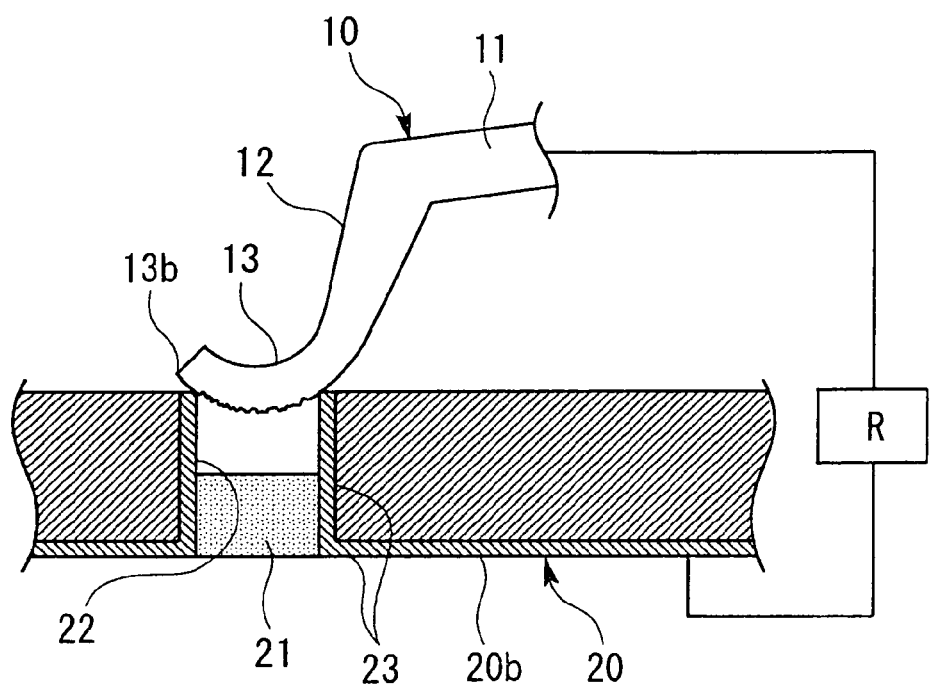
FIG. 6 is a sectional diagram illustrating a state of use of the probe of the first embodiment according the present invention and illustrating a case where a through hole in a circuit board is only partly filled with conductor.

Further, as illustrated in FIG. 6, when the through hole 22 is only partly filled with the conductor 21, electric current which flows between the probe 10 and the rear surface 20b of the circuit board 20 passes through the plating 23 in the through hole 22 and the conductor 21 which only partly fills the through hole 22.

Therefore, the resistance between the upper end surface 20a and the lower end surface 20b of the plating 23 measured by the probe card 1 is higher than that of a case where the through hole 22 is completely filled with the conductor 21, and lower than that of a case where the through hole 22 is hardly filled with the conductor 21. From the result of the measurement, it can be determined that the through hole 22 is only partly filled with the conductor 21.

Further, as described above, the probe 10 of the present invention is provided with the abrasion marks 14 over the contact surface 13a of the contact portion 13 which is to be brought into contact with the circuit board 20.

Figure 7:
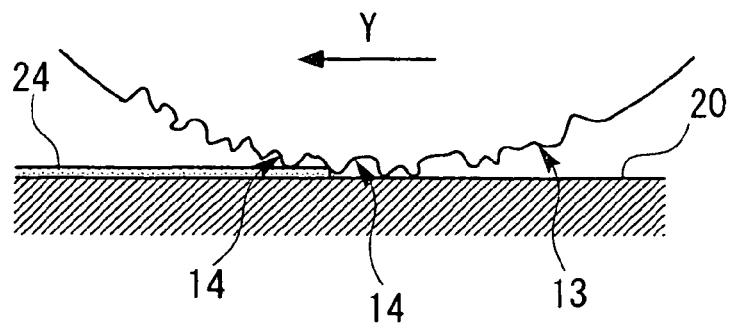
FIG. 7 is a diagram illustrating a state where an oxide film on the circuit board is scraped off by the rough surface having abrasion-like marks of the probe of the first embodiment according to the present invention.

Therefore, when the probe card 1 descends to cause the contact portion 13 to slide in a longitudinal direction Y of the probe 10 as illustrated in FIG. 7, an oxide film 24 formed on the surface of the circuit board 20 is scraped off by the abrasion marks 14.

This makes it possible to attain stable electrical contact between the contact portion 13 of the probe 10 and the conductor 21.

Second Embodiment

Figure 8:
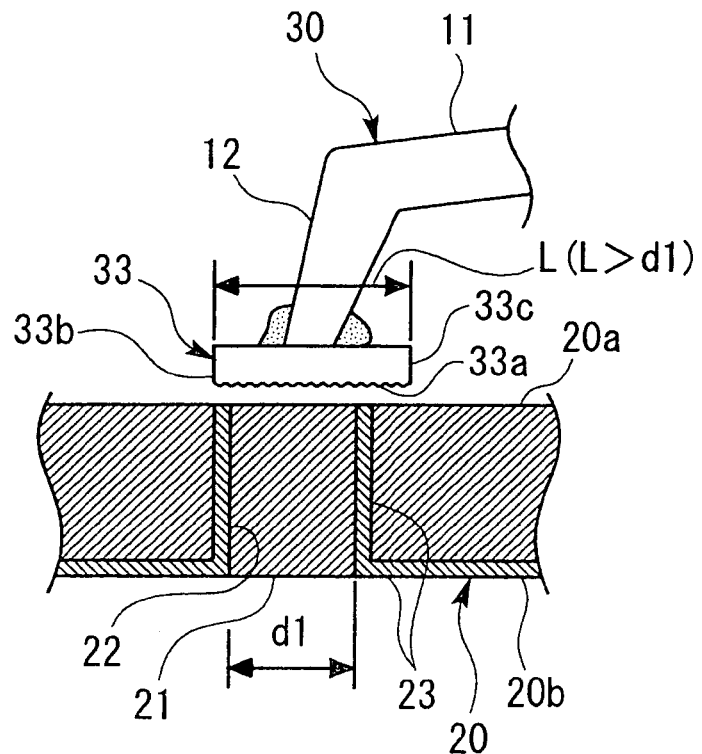
FIG. 8 is a sectional diagram illustrating a probe according to a second embodiment of the present invention.

FIG. 8 illustrates a probe 30 according to a second embodiment of the present invention. It should be noted that parts of the probe 30 similar to those of the probe 10 of the first embodiment are designated by the same reference numerals and detailed description thereof will be omitted.

The probe 30 has a leg portion 11, a bent portion 12, and a linear contact portion 33. The contact portion 33 is made of a material having an electrical conductivity. The contact portion 33 is fixed to a tip of the bent portion 12 by means of using an electrically conductive adhesive or welding.

Further, the contact portion 33 is disposed substantially in parallel with a surface 20a to be tested of a circuit board 20. The length L of the contact portion 33 is longer than the diameter d1 of a through hole 22 in the circuit board 20.

Figure 9:
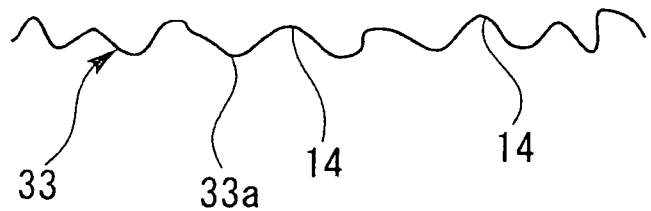
FIG. 9 is a diagram illustrating a rough surface having abrasion-like marks of the probe of the second embodiment according to the present invention.

Further, as illustrated in FIG. 9, abrasion marks 14 are formed over a contact surface 33a of the contact portion 33 which is brought into contact with the circuit board 20.

In a case where a test is performed for conductive state (filled state) of a conductor 21 in the through hole 22 of the circuit board 20 by a probe card 1 having the probe 30, the contact portion 33 of the probe 30 is disposed over the through hole 22 of the circuit board 20 and over the conductor 21 as illustrated in FIG. 8. Further, both end surfaces 33b and 33c of the contact portion 33 are disposed outside the through hole 22.

Accordingly, the contact portion 33 of the probe 30 is prevented from entering in the through hole 22 even when the through hole 22 of the circuit board 20 is hardly filled with the conductor 21 or when the through hole 22 is only partly filled with the conductor 21.

Therefore, it is possible to perform a test for conductive state (filled state) of the conductor 21 accurately even in the case where the through hole 22 is completely filled with the conductor 21, where the through hole 22 is hardly filled with the conductor 21, or where the through hole 22 is only partly filled with the conductor 21.

Third Embodiment

Figure 10:
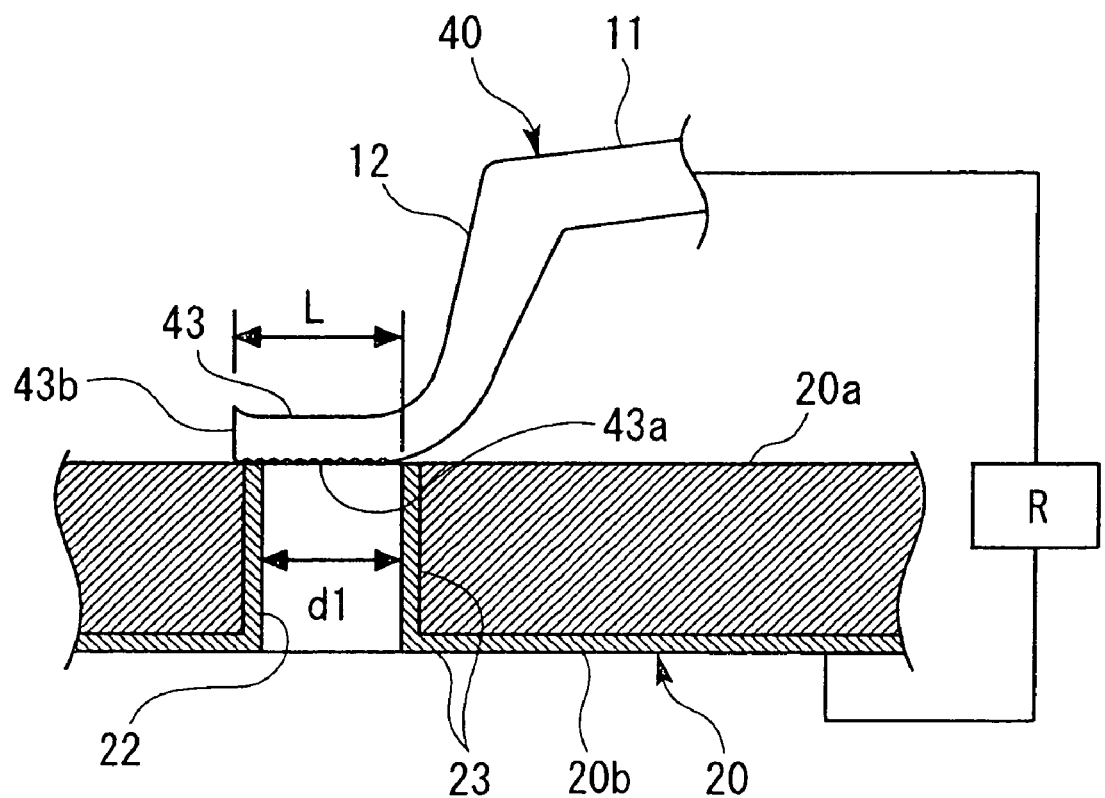
FIG. 10 is a sectional diagram illustrating a probe according to a third embodiment of the present invention.

FIG. 10 illustrates a probe 40 according to a third embodiment of the present invention. The probe 40 has a leg portion 11, a bent portion 12, and a linear contact portion 43.

The contact portion 43 is formed by bending a tip side of the bent portion 12 so as to be in parallel with a probe card 1. The length L of the contact portion 43 is formed to be longer than the diameter d1 of a through hole 22.

Figure 11:
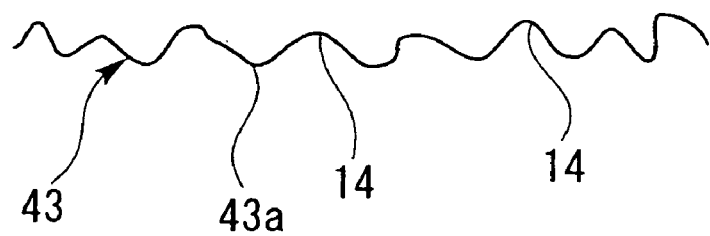
FIG. 11 is a diagram illustrating a rough surface having abrasion-like marks of the probe of the third embodiment according to the present invention.

As illustrated in FIG. 11, abrasion marks 14 are formed on a contact surface 43a of which the contact portion 43 which is brought into contact with the circuit board 20.

In a care where a test is performed for conductive state (filled state) of the conductor 21 in the through hole 22 of the circuit board 20 by a probe card 1 having the probe 40, the contact portion 43 of the probe 40 is disposed over the through hole 22 in the circuit board 20 and the conductor 21. A tips surface 43b of the contact portion 43 is disposed outside the through hole 22.

The contact portion 43 of the probe 40 can be prevented from entering in the through hole 22 even when the through hole 22 is hardly filled with the conductor 21 or the through hole 22 is only partly filled with the conductor 21. Therefore, it is possible to perform a test for conductive state of the conductor 21 in the through hole 22 with precision.

Fourth Embodiment

Figure 12:
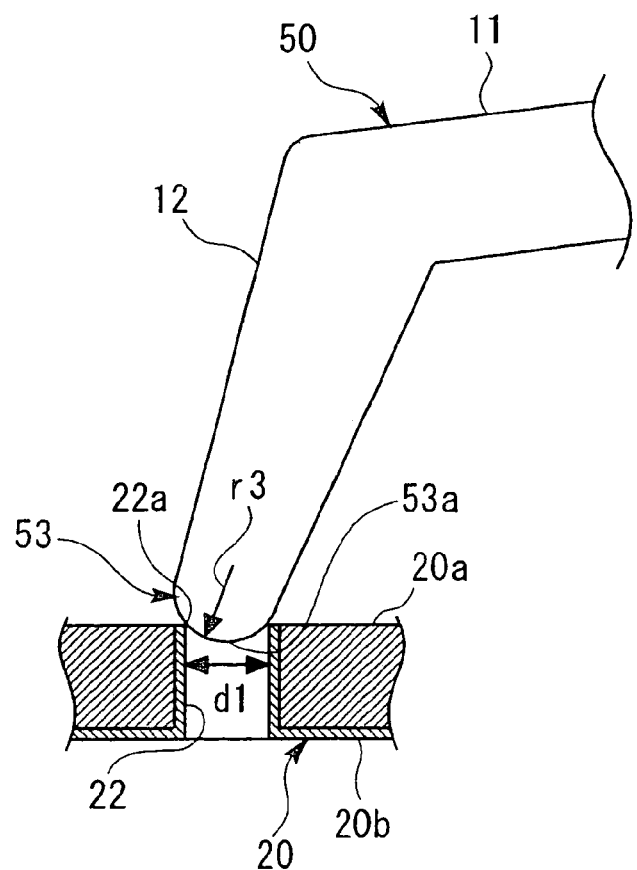
FIG. 12 is a diagram illustrating a probe according to a fourth embodiment of the present invention.

FIG. 12 illustrates a probe 50 according to a fourth embodiment of the present invention. The probe 50 has a leg portion 11, a bent portion 12, and a contact portion 53.

The contact portion 53 is provided with the bent portion 12 having the tip thereof formed to be hemispherical. A radius of curvature r3 of the contact portion 53 is larger than the radius r1 of the through hole 22 in the circuit board 20 (r1=d1/2).

Figure 13:
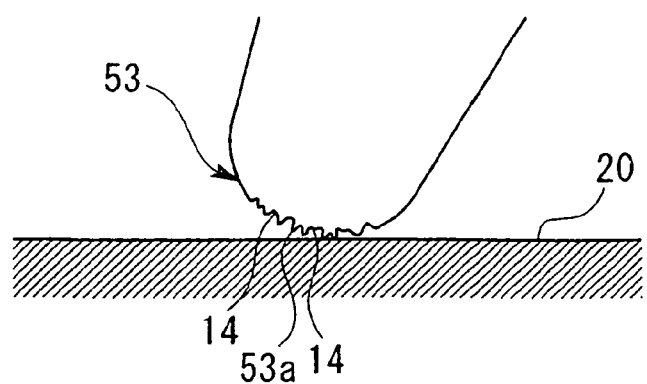
FIG. 13 is a diagram illustrating a rough surface having abrasion-like marks of the probe of the fourth embodiment according to the present invention.

Further, as illustrated in FIG. 13, abrasion marks 14 are provided over a contact surface 53a of the contact portion 53 is which brought into contact with the circuit board 20.

In a case where a test is perform for conductive state (filled state) of conductor 21 in the through hole 22 of the circuit board 20 by a probe card 1 having the probe 50, the contact portion 53 is disposed over the through hole 22 and the conductor 21.

Figure 14:
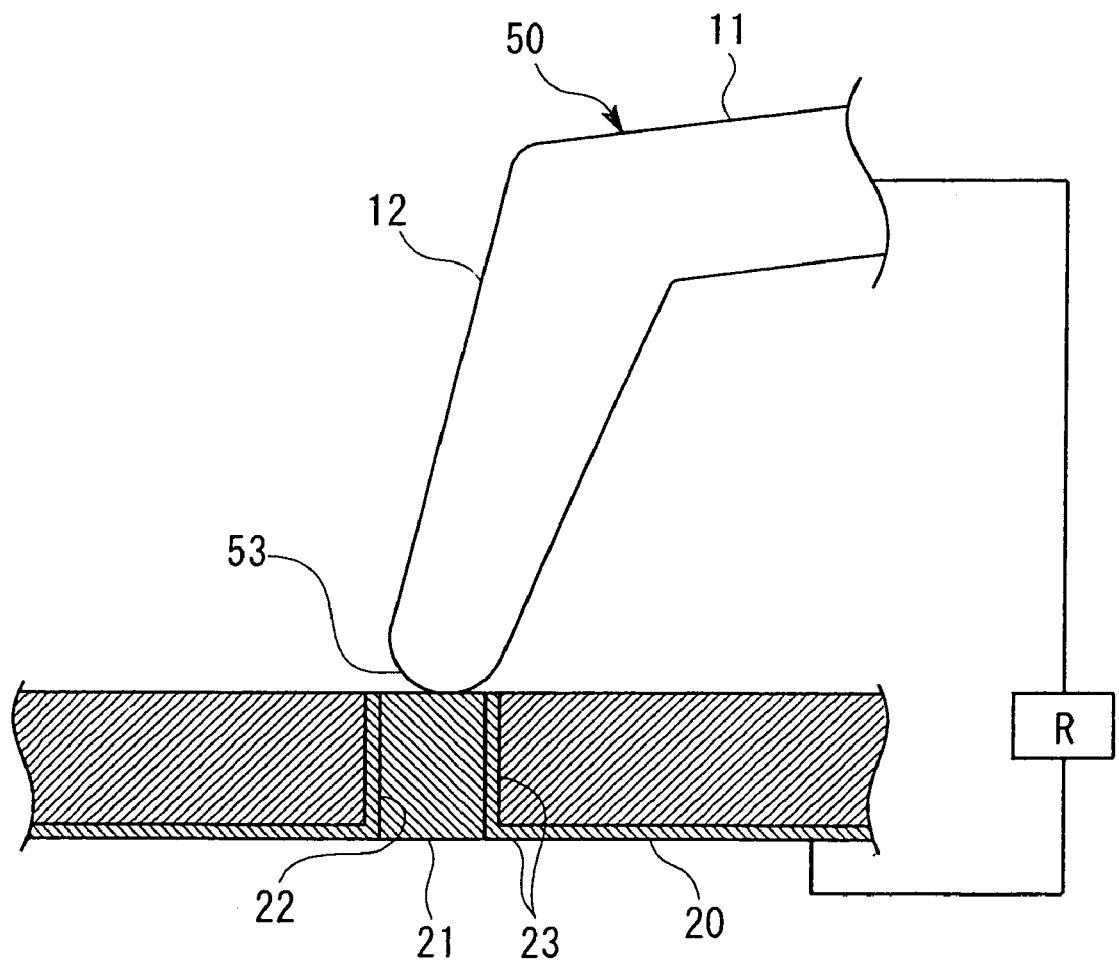
FIG. 14 is a diagram illustrating a state of use to of the probe of the fourth embodiment according to the present invention.

Here, as illustrated in FIG. 14, when the through hole 22 is completely filled with the conductor 21, the contact portion 53 is brought into contact with the conductor 21. Further, a test for conductivity of the conductor 21 can be made accurately.

Further, when the through hole 22 is hardly filled with the conductor 21 as illustrated in FIG. 12, or when the through hole 22 is only partly filled with the conductor 21 (not shown), the contact portion 53 is locked on the edge of an opening 22a of the through hole 22.

Accordingly, the contact portion 53 is prevented from entering in the through hole 22. Therefore, it is possible to test how well the through hole 22 is filled with the conductor 21, accurately.

Figure 15:
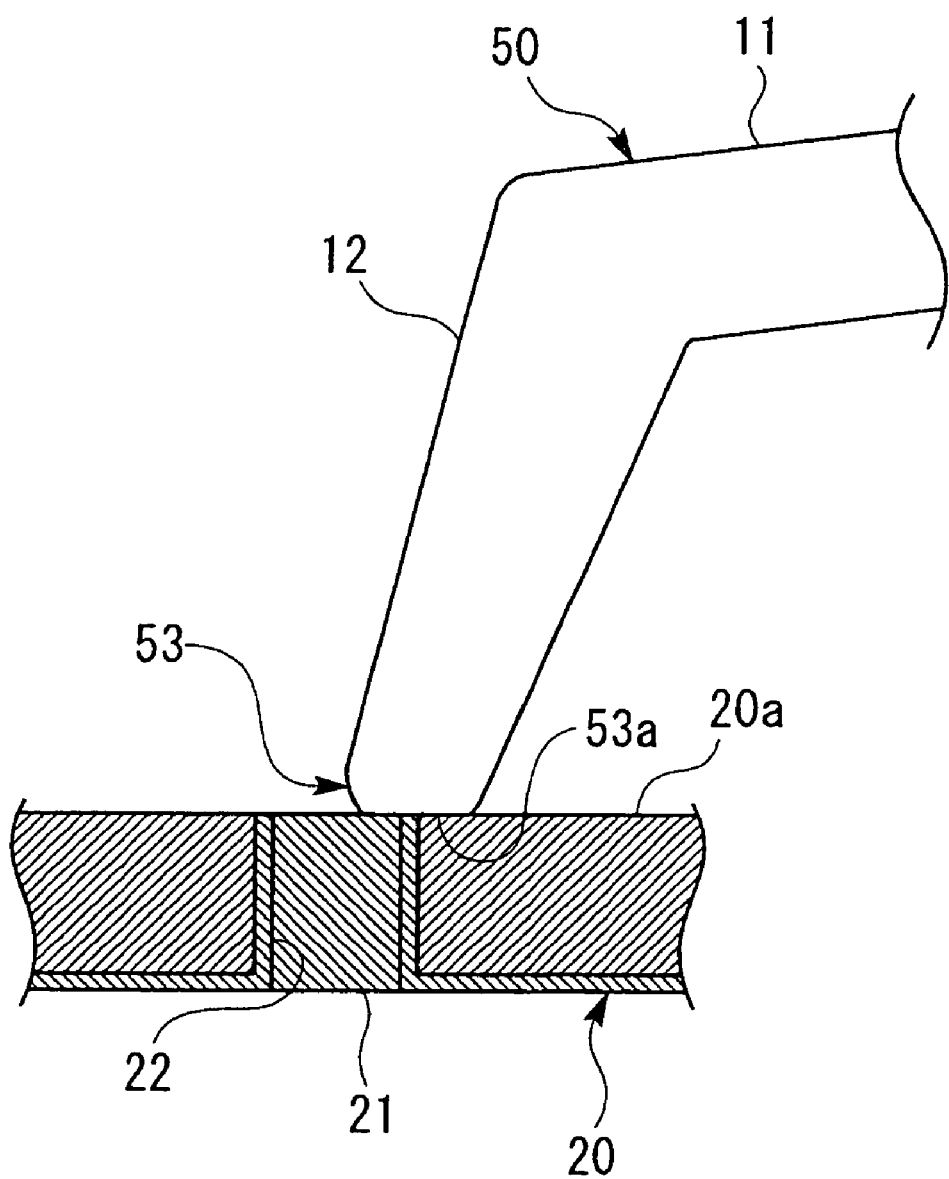
FIG. 15 is a diagram illustrating a variation of the probe of the fourth embodiment according to the present invention.

It should be noted that the contact surface 53a of the contact portion 53 may be a flat surface which is in parallel with a surface 20a of the circuit board 20 as illustrated in FIG. 15. Abrasion marks 14 (not shown) may be provided on the contact surface 53a.

By forming the contact surface 53a of the contact portion 53 is a flat surface, even when the contact portion 53 is misaligned with the through hole 22 to some extent, it is possible to bring the contact surface 53a into contact with the conductor 21 in the through hole 22, which makes it possible to perform the test precisely.

Fifth Embodiment

Figure 16:
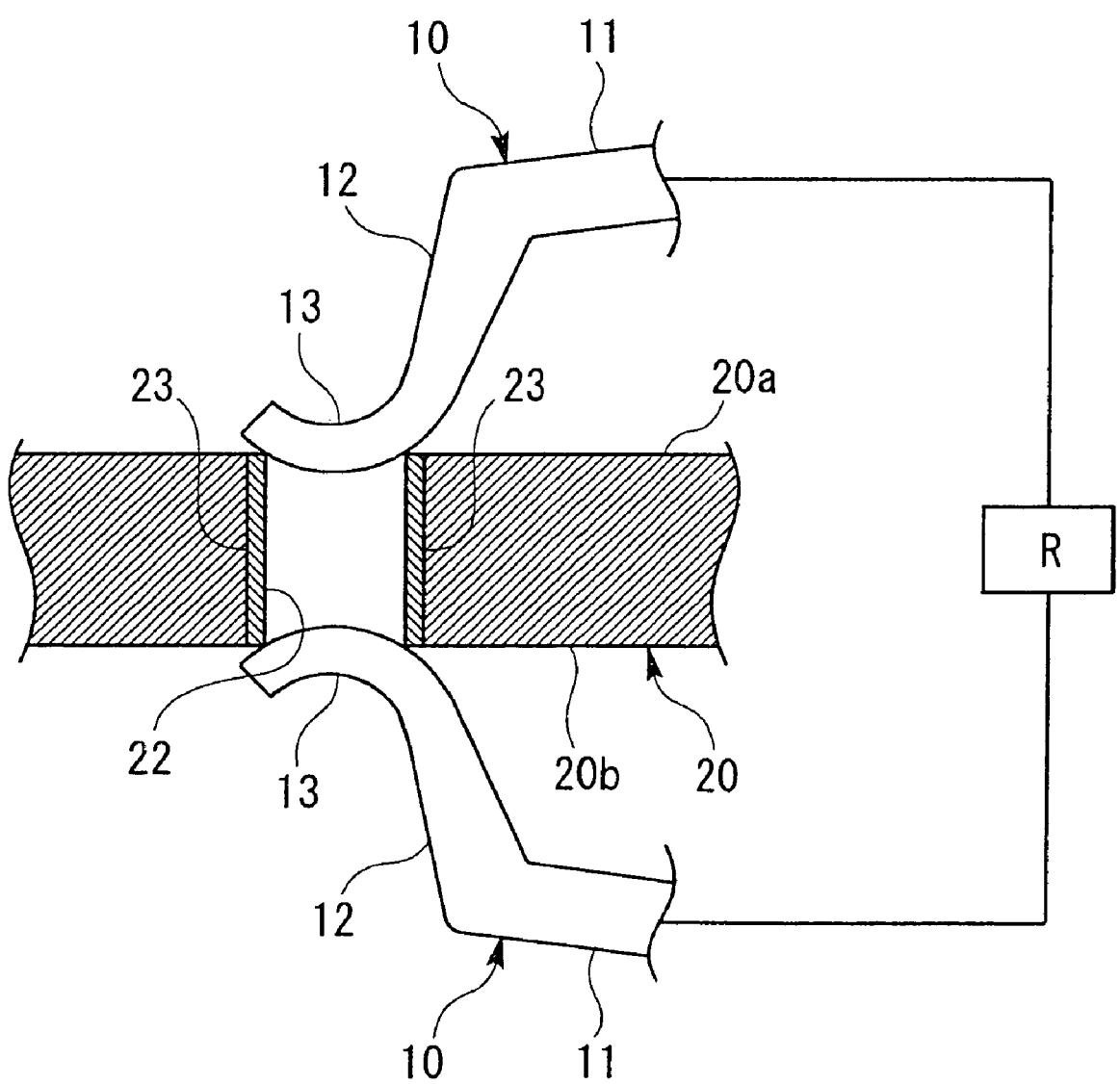
FIG. 16 is a diagram illustrating a state where a probe according to a fifth embodiment of the present invention is disposed on each side of a circuit board.

While, in the above first to fourth embodiments, the cases where the plating 23 is formed on the rear surface 20b of the circuit board 20 and on the inner surface of the through hole 22 are described, there is another case where the plating 23 is formed only on the inner surface of the through hole 22 as illustrated in FIG. 16.

In this case, the probe card 1 (see FIG. 1) and the probe 10 are disposed on both of a front surface 20a and a rear surface 20b of a circuit board 20. This makes it possible to measure, by the probes 10, 10 on both sides, the resistance between the upper end surface 20a and the lower end surface 20b of the plating 23 provided on the inner periphery of the through hole 22. Therefore, it is possible to perform the test for conductive state of the conductor 21 in the through hole 22 with precision.

Sixth Embodiment

Figure 17:
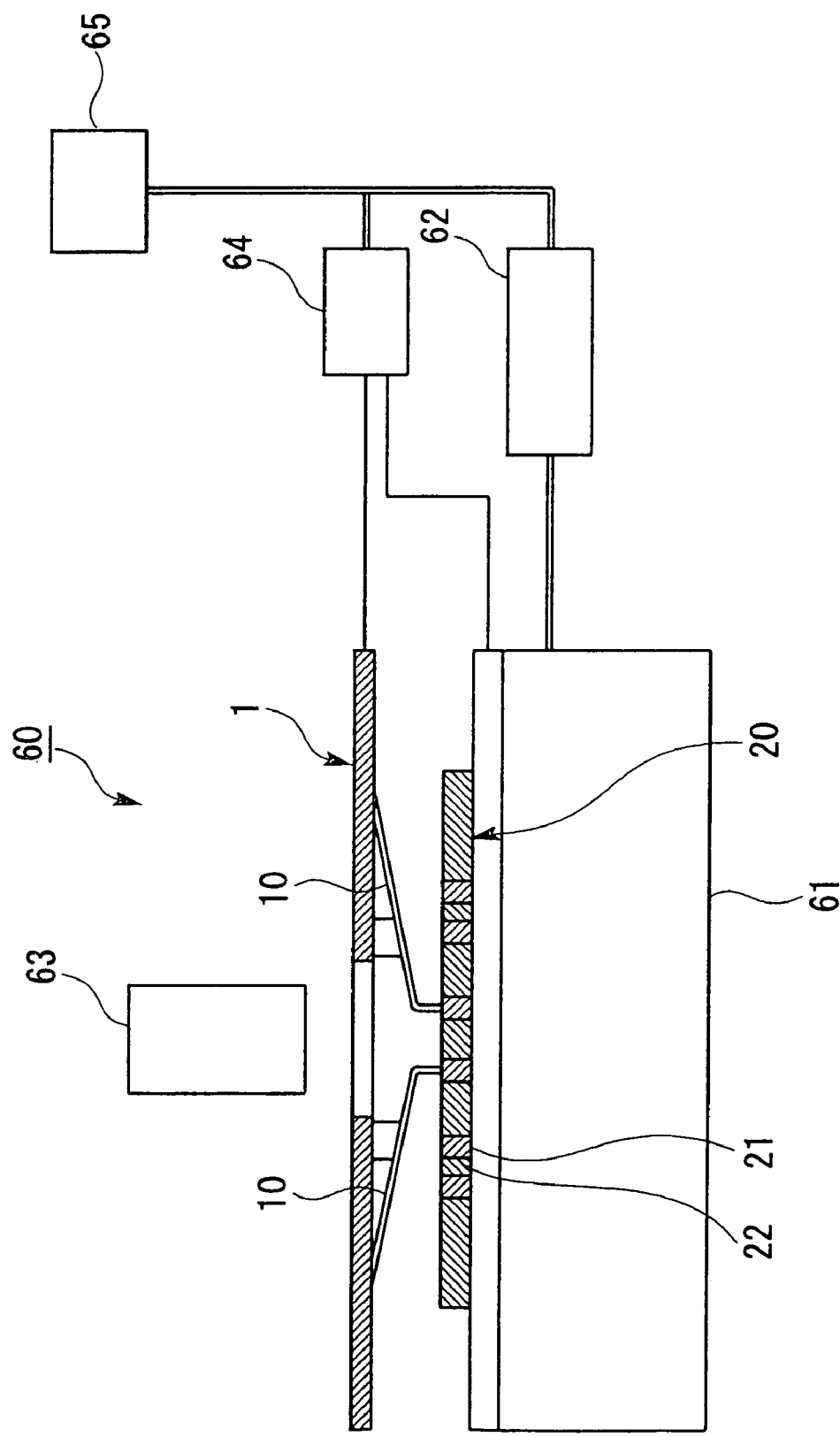
FIG. 17 is a diagram illustrating a testing device for testing a circuit board according to a sixth embodiment of the present invention.

FIG. 17 illustrates a testing device 60 of a circuit board according to a sixth embodiment of the present invention. The testing device 60 of a circuit board is provided with a mechanism portion 61 having a vacuum chuck for holding a circuit board 20, and with X, Y, Z, and θ stages for adjusting the position of the circuit board 20, and the like, a control portion 62 for controlling the mechanism portion 61, the probe card 1, alignment mark detecting devices 63 for recognizing a mark for positioning the circuit board 20, measuring devices 64 for carrying out a measurement of predetermined items such as the resistance of a portion to be measured, and a personal computer 65.

The probe card 1 is provided with the probe 10 of the first embodiment. It should be noted that the probe card 1 may also be provided with, instead of the probe 10, the probe 30, 40, or 50 of the second, third, fourth, or fifth embodiment described above.

Figure 18:
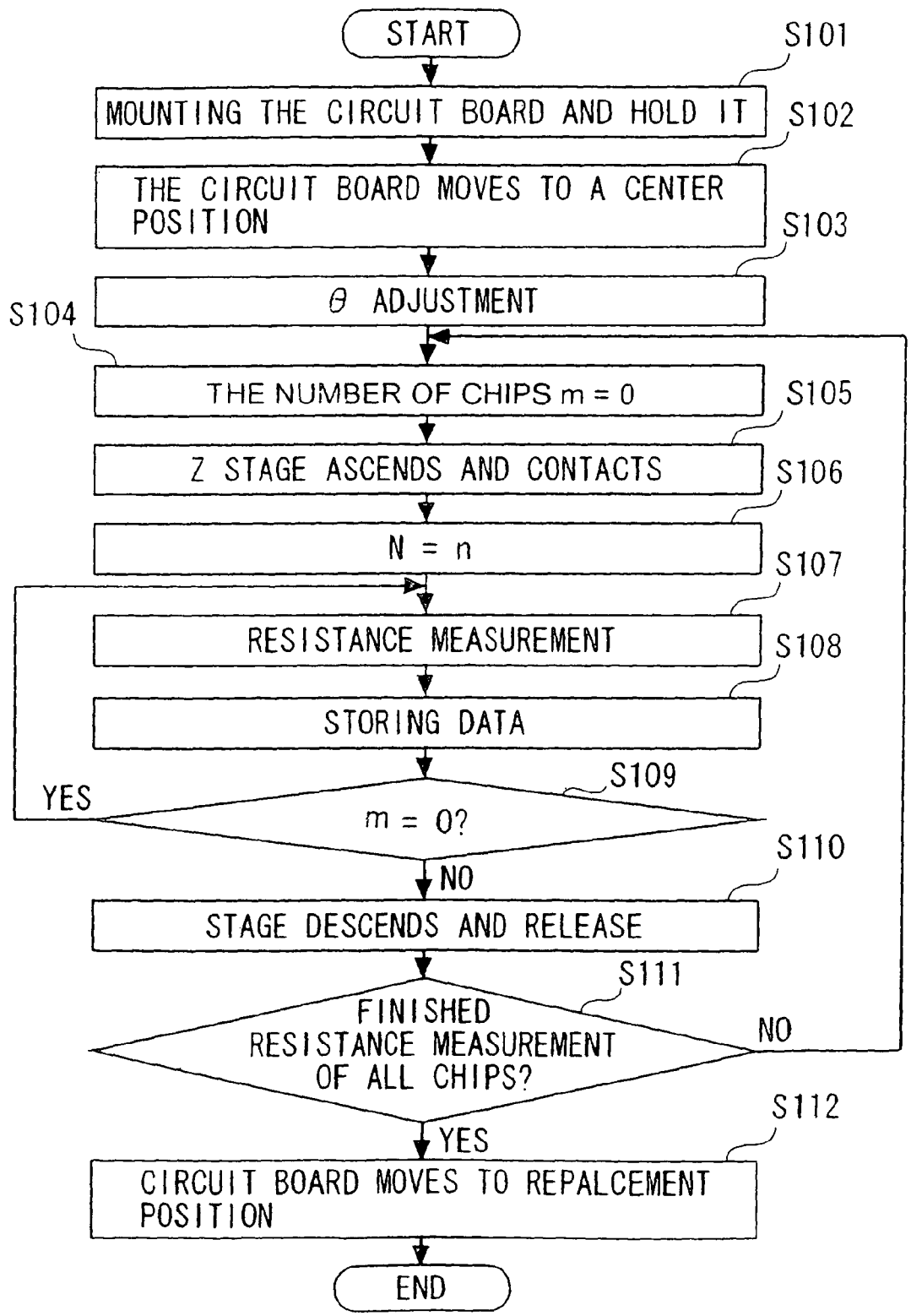
FIG. 18 is a flow chart of a test procedure performed by the testing device for testing the circuit board according to the fifth embodiment of the present invention.
Figure 19:
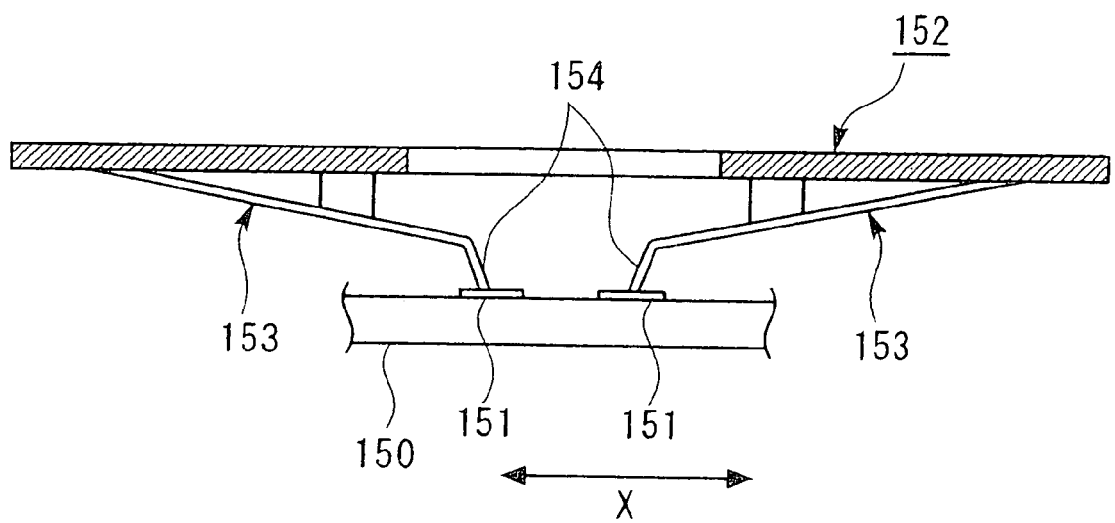
FIG. 19 is a diagram illustrating a conventional probe card.
Figure 20:
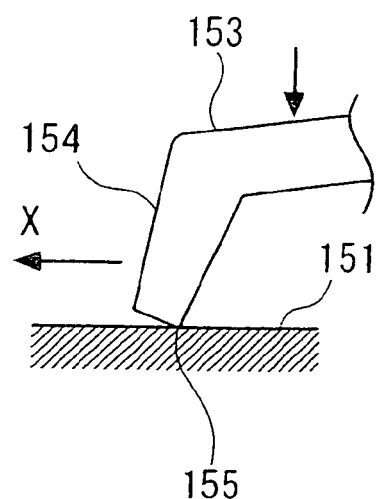
FIG. 20 is a diagram illustrating a conventional probe.
Figure 21:
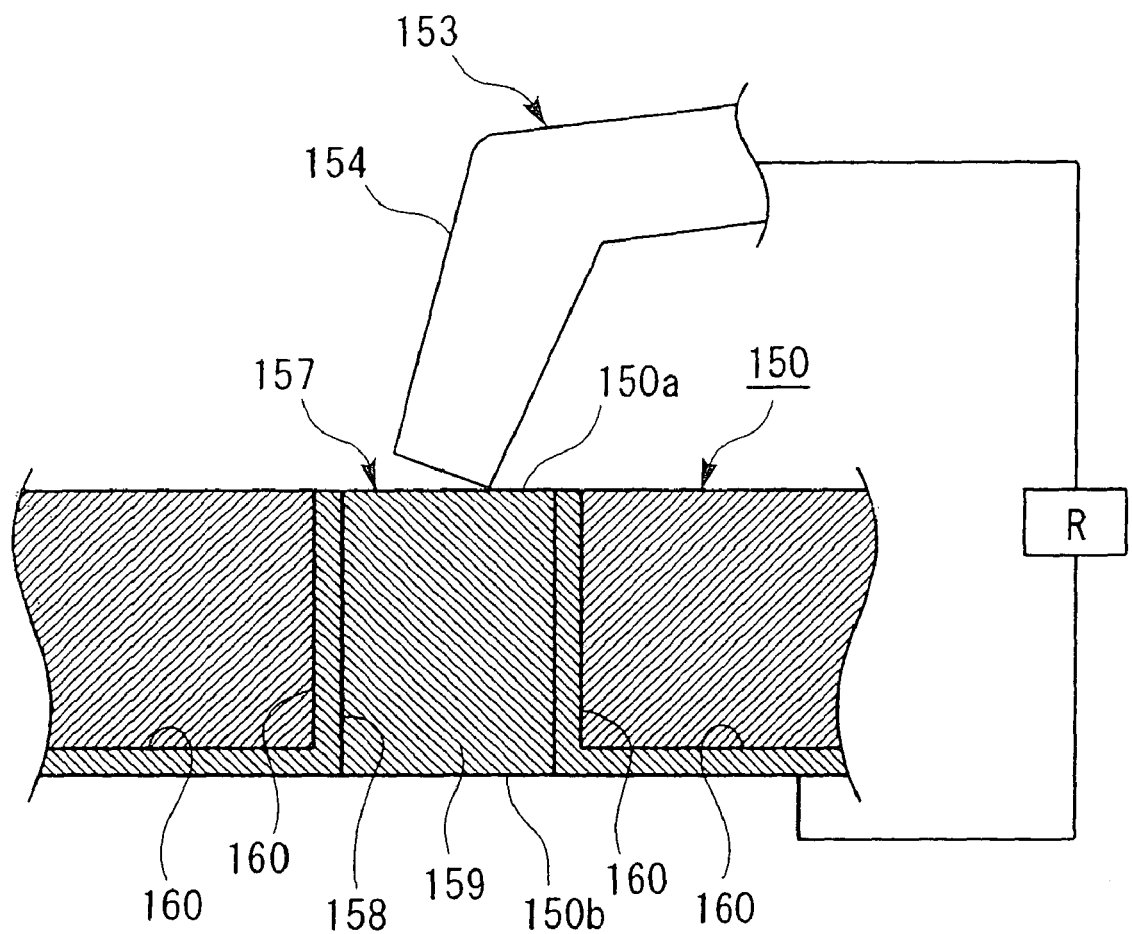
FIG. 21 is a diagram illustrating a state of use of the conventional probe and illustrating a case where a through hole in a circuit board is completely filled with conductor.
Figure 22:
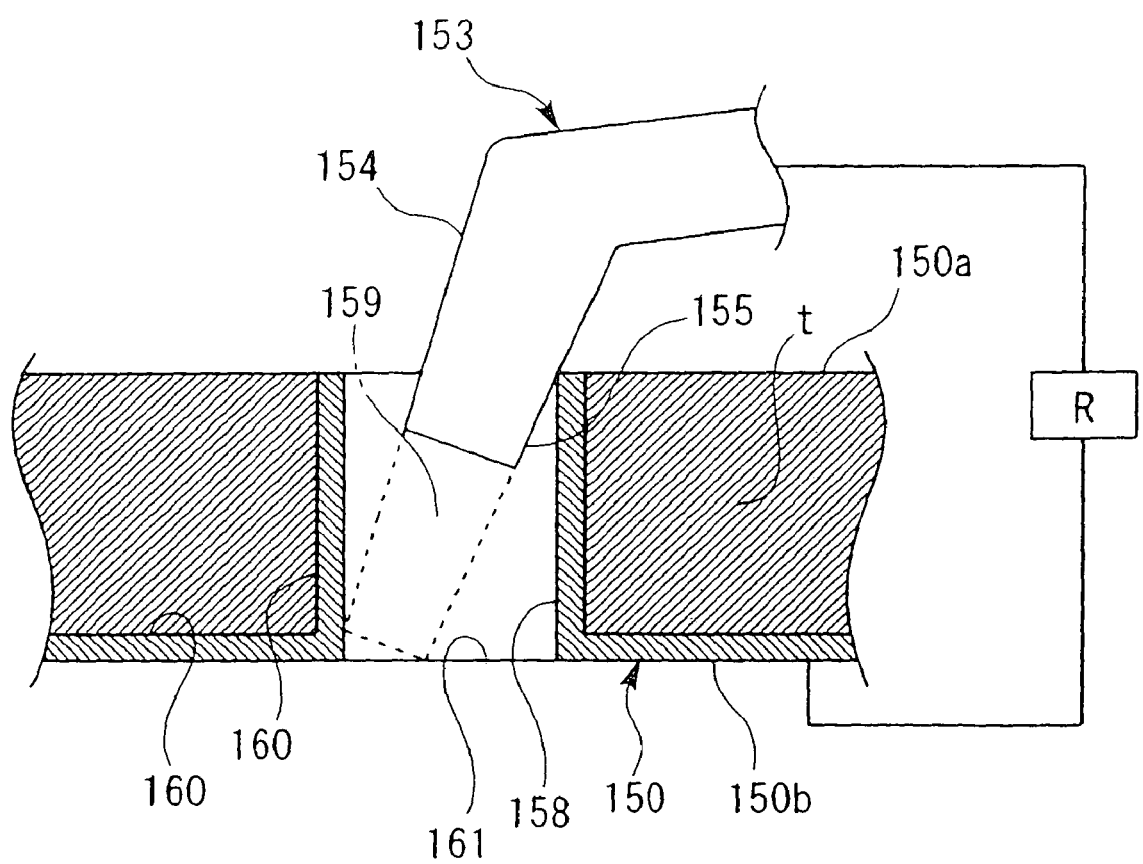
FIG. 22 is a diagram illustrating a state of use of the conventional probe and illustrating a case where the through hole in the circuit board is hardly filled with conductor.

FIG. 18 is a flow chart illustrating a test procedure performed by the testing device 60 of the circuit board. In the present description, there are n through holes in one chip and there are m chips in a circuit board or a wafer. All the through holes in one chip are collectively brought into contact with the probe. Actually, the through holes may be brought into contact with probes collectively or individually.

Further, in this embodiment, a plurality of chips are provided on the circuit board 20 and a plurality of through holes 22 are provided in each chip. A case where all the through holes in each chip are simultaneously tested will be described.

Here, first, the circuit board 20 is mounted on a predetermined position of the mechanism portion 61 and is held by the vacuum chuck (S101). Next, the circuit board 20 is moved to a center position and position adjustment is made in X, Y, and Z directions (S102). Then, adjustment of the rotational position of the circuit board 20 (θ adjustment) is made (S103).

This adjustment of the rotational position is made in order to align an arrangement of the plurality of through holes 22 provided in the circuit board 20 with an arrangement of the plurality of probes 10 of the probe card 1. The adjustment is made based on the result of detection performed by the alignment mark detecting device 63.

When it is determined that the number of chip m is 0 (S104), the Z stage ascends. When the through hole 22 is completely filled with the conductor 21, the contact portion 13 of the probe 10 is brought into contact with the conductor 21 in the through hole 22. When the through hole 22 is hardly filled with the conductor 21 or when the through hole 22 is only partly filled with the conductor 21, the contact portion 13 of the probe 10 is brought into contact with plating 23 provided on the inner surface of the through hole 22 (S105).

Then, the number n of the tests (n=1, 2, 3, ... ) is set based on a predetermined number N (S106). Next, the resistance between the upper end surface 20a and the lower end surface 20b of the conductor 21 and the resistance of the plating 23 provided on the inner periphery of the through hole 22 are measured by the measuring device 64 (S107). Then, the result of measurement is stored in a database or the like (S108).

Further, it is determined whether the number of chip m is 0 or not (S109). When the number of chip m is 0, the resistance is measured in the above step (S107).

When the number of chip m is not 0, the stage further descends (S110). Next it is determined whether measurement of the resistance is completed or not with respect to all the chips on the circuit board 20 (S111).

When it is determined in the above step (S111), that the test is completed on all the chips, the circuit board 20 is moved to a replacement position (S112). Further, the test result is displayed on the personal computer 65. This is the end of the test on one circuit board 20.

When it is determined in the above step (S111), that the test is not completed on all the chips, then, the processes are repeated from the above step (S104).

Accordingly, the testing device 60 of a circuit board or the like according to the present invention can test states of conductivity of the conductor 21 is many through holes 22 provided in the circuit board 20 and to be filled with the conductor 21, simultaneously and accurately. Therefore, the test on the circuit board 20 can be completed in a short time.

It should be noted that, although the above first to sixth embodiments describe the cases where the present invention is applied to a circuit board having a through hole in which the conductive wiring is provided, the present invention is also applicable to a wafer having a hole in which the conductive wiring is to be provided or the like.

<Others>

The disclosures of Japanese patent application No. JP2006-042313 filed on Feb. 20, 2006 including the specification, drawings and abstract are incorporated herein by reference.

What is claimed is:

1. A probe performing a test for conductivity of a conductive wiring in a hole which is a contact hole or a through hole provided in a circuit board, comprising:
   a long and elastically deformable leg portion;
   a bent portion which is provided on a tip side of the leg portion and extends to the circuit board; and
   a contact portion provided on a tip side of the bent portion to be brought into contact with the conductive wiring, with the elasticity possessed by the probe itself,
   wherein the contact portion is formed to be in a shape of an arc having a radius of curvature larger than a radius of the through hole so that the whole of contact portion is prevented from entering the through hole,
   wherein a length of the contact portion in a longitudinal direction is longer than a diameter of the through hole,
   wherein a contact surface of the contact portion which is brought into contact with the conductive wiring is given a rough shape like an abrasion mark extending in a direction to cross the longitudinal direction of the contact portion, and
   wherein the contact portion is slidable in the longitudinal direction when the contact portion is brought into contact with the conductive wiring.

2. The probe according to claim 1, wherein the contact portion is formed by bending the tip side of the leg portion.

* * * * *